United States Patent [19]
Lytle et al.

[11] Patent Number: 5,712,176
[45] Date of Patent: Jan. 27, 1998

[54] DOPING OF SILICON LAYERS

[75] Inventors: Steven Alan Lytle; Yaw Samuel Obeng; Eric John Persson, all of Orlando, Fla.

[73] Assignee: Lucent Technologies Inc., Murray Hill, N.J.

[21] Appl. No.: 497,470

[22] Filed: Jun. 30, 1995

[51] Int. Cl.[6] .................................................. H01L 21/8234
[52] U.S. Cl. ...................... 437/40 GS; 437/141; 437/164
[58] Field of Search ................................. 437/40 GS, 141, 437/160, 163, 164, 240, 41 GS

[56] References Cited

U.S. PATENT DOCUMENTS

| | | | |
|---|---|---|---|
| 3,507,716 | 4/1970 | Nishida et al. | 437/164 |
| 3,943,015 | 3/1976 | Ing | 437/164 |
| 4,830,974 | 5/1989 | Chang et al. | 437/43 |
| 5,244,831 | 9/1993 | Hindman et al. | 437/164 |
| 5,286,660 | 2/1994 | Chiou et al. | 437/141 |
| 5,494,852 | 2/1996 | Gwin | 437/164 |

*Primary Examiner*—Michael Trinh
*Attorney, Agent, or Firm*—John T. Rehberg

[57] ABSTRACT

A process for forming a $P_2O_5$ layer suitable for diffusion doping polysilicon gates is disclosed. The inventive process has a reduced thermal budget and helps to eliminate subsequent gate oxide roughness.

10 Claims, 1 Drawing Sheet

DOPING OF SILICON LAYERS

TECHNICAL FIELD

This invention relates to methods of integrated circuit fabrication.

BACKGROUND OF THE INVENTION

Typical MOS integrated circuit fabrication involves the formation of field oxides followed by the blanket growth of a gate oxide and a polysilicon layer. The polysilicon layer is then, doped ex-situ. Subsequently, the doped polysilicon layer is patterned, together with the underlying oxide to form a gate.

Typically, polysilicon layers are formed from the pyrolysis of various silicon precursors. The most popular practice is to form undoped polysilicon from silane deposited at a temperature range between 600°–620° C.

The undoped polysilicon films are then doped by diffusion from solid dopant films, e.g., $P_2O_5$ layers formed on top of the polysilicon layer at elevated temperatures (880°–1000° C.). A typical example of the thermal cycle and gas flow schemes for a current doping process is given in FIG. 1. Table 1 below indicates the appropriate temperatures, gas flows and durations for each of the steps in the cycle depicted in FIG. 1.

TABLE 1

| STEP | TEMP. (°C.) | RAMP RATE (°C./min.) | GAS FLOW | DURATION (minutes) |
|---|---|---|---|---|
| 1 | 750 | — | 27.0 lpm $N_2$ | — |
| 2 | Variable, increasing | 3.7 | 27.0 lpm $N_2$ | 40 |
| 3 | 900 | — | 27.0 lpm $N_2$ 0.8 lpm $O_2$ | 35 |
| 4 | 900 | — | 1.5 lpm $N_2$/$PBr_3$ 7.0 lpm $N_2$ 0.14 lpm $O_2$ | 40 |
| 5 | 900 | — | 23.0 lpm $N_2$ 0.27 lpm $O_2$ | 33.5 |
| 6 | Variable, decreasing | 2.1 | 23.0 lpm $N_2$ 0.27 lpm $O_2$ | 70 |
| 7 | 750 | — | 23.0 lpm $N_2$ 0.2 lpm $O_2$ | |

At the high temperatures used for ex-situ doping of polysilicon layers, the polysilicon tends to recrystalize and undergo secondary (abnormal) grain growth. These growths (also termed "reconstructions"), manifest themselves as protrusions of silicon grains surrounded by large even domains of silicon and result in increased film roughness. The film reconstruction is also catalyzed by the dopants introduced into the silicon to improve conductivity.

During the doping process dopants accumulate at the grain boundaries in the silicon layer. This uneven dopant distribution results in uneven etching of the silicon layer. In the case of phosphorus doped film, the heavily doped areas etch faster than the lightly doped areas. Consequently, the structure or projections of the polysilicon grains are etched into the underlying gate oxide to produce "texture" in underlying oxide film resulting in some areas of the gate oxide being thinner than intended. At the designed working voltages, junction leakages may occur in areas in the textured oxide films particularly where breakthrough occurs, thus producing device failures.

SUMMARY OF THE INVENTION

Accordingly, an improved method of manufacturing integrated circuits includes:

forming a polysilicon layer overlying a substrate;

exposing the polysilicon layer to an ambient at an elevated temperature;

exposing the polysilicon layer while at an elevated temperature to a gas flow containing a dopant for a period of time;

terminating the dopant gas flow and simultaneously permitting the temperature of the ambient to decrease, the dopant diffusing into the polysilicon layer;

patterning the polysilicon layer to define a gate;

and forming source and drain regions.

Alternatively, another illustrative embodiment includes:

forming a polysilicon layer overlying a substrate;

exposing the polysilicon layer to an ambient elevated temperature for less than five minutes; exposing the polysilicon layer to dopant gas flow for a period of time;

terminating the dopant gas flow;

permitting the temperature of the ambient to decrease, the dopant diffusing into the polysilicon layer;

patterning the polysilicon layer to define a gate;

and forming source and drain regions.

Alternatively, another illustrative embodiment includes:

forming a polysilicon layer overlying a substrate;

exposing a polysilicon layer to a dopant gas flow for less than 30 minutes;

terminating the dopant gas flow, permitting the temperature of the ambient to decrease, the dopant diffusing into the polysilicon layer;

patterning the polysilicon layer to define a gate;

forming source and drain regions.

DETAILED DESCRIPTION

Figure 3:
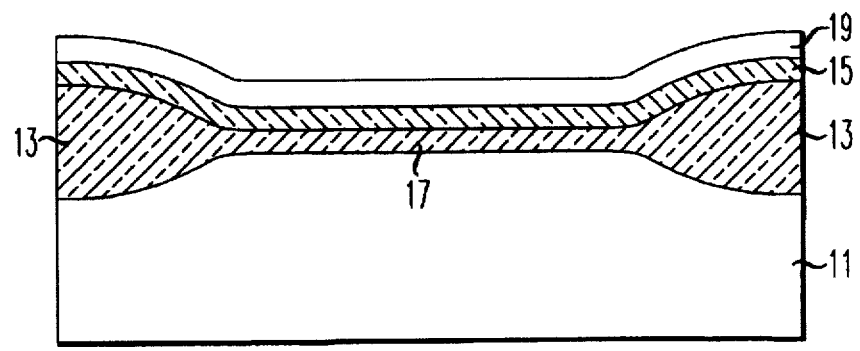
FIG. 3 is a cross-sectional view of a partially fabricated semiconductor integrated circuit.

Referring to FIG. 3, reference numeral 11 denotes a substrate which may be silicon, epitaxial silicon, doped silicon, etc. In general, the term substrate refers to a body of material upon which other materials may be formed or deposited. Reference numeral 13 denotes a field oxide; reference numeral 17 denotes a gate oxide. Reference numeral 15 denotes a blanket layer of polysilicon. Reference numeral 19 denotes a blanket layer of $P_2O_5$ which is formed above and in contact with polysilicon layer 15.

Figure 1:
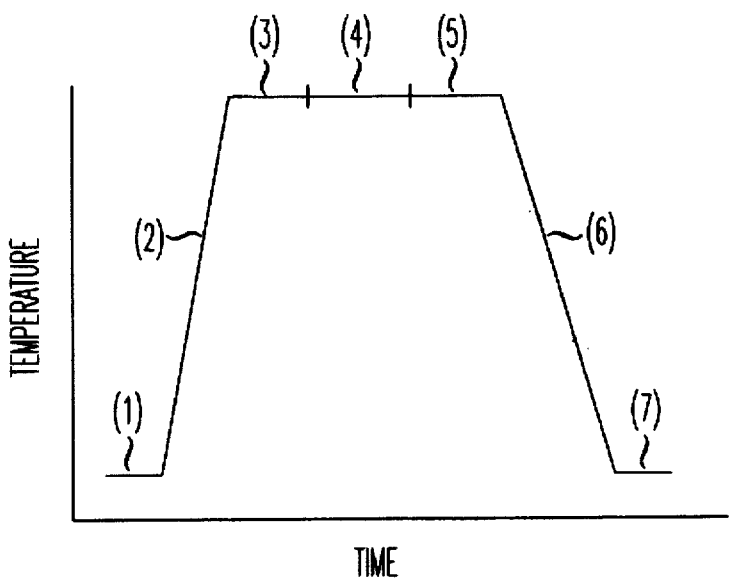
FIG. 1 is a graph of time and temperature for a typical previously-practiced ex-situ doping process involving the formation of a $P_2O_5$ layer upon the polysilicon layer and the subsequent diffusion.

In previous practice, a process depicted by FIG. 1 and Table 1 was utilized to form layer 19 and to subsequently dope layer 15 with phosphorus by diffusion. Referring to Table 1 and FIG. 1, step 1 which involves introducing nitrogen into the reaction chamber at a temperature of 750° C. purges the chamber of oxygen and other reactant gases. In step 2 the temperature is gradually increased while nitrogen continues to flow. In step 3, while the chamber is at a temperature of 900° C., oxygen, together with nitrogen, enters the chamber. In step 4, while the chamber temperature is still maintained at 900° C., a gas containing phosphorus dopant precursor (i.e., PBr₃) together with oxygen and nitrogen is introduced into the chamber. Next, in step 5 (also at 900° C.), the phosphorus-containing gas is eliminated and only oxygen and nitrogen continue to flow. By this time the layer of P₂O₅, reference numeral 19, FIG. 3, has been formed. Step 5 is a post-doping annealing step. Finally, in step 6 the temperature of the chamber is decreased while nitrogen and oxygen continue to flow until the initial ambient (step 7) of 750° C. is reached.

Wafers may be then removed from the chamber and layer 19 stripped, leaving blanket layers 15 and 17 which may be subsequently patterned to form MOS gates.

Figure 2:
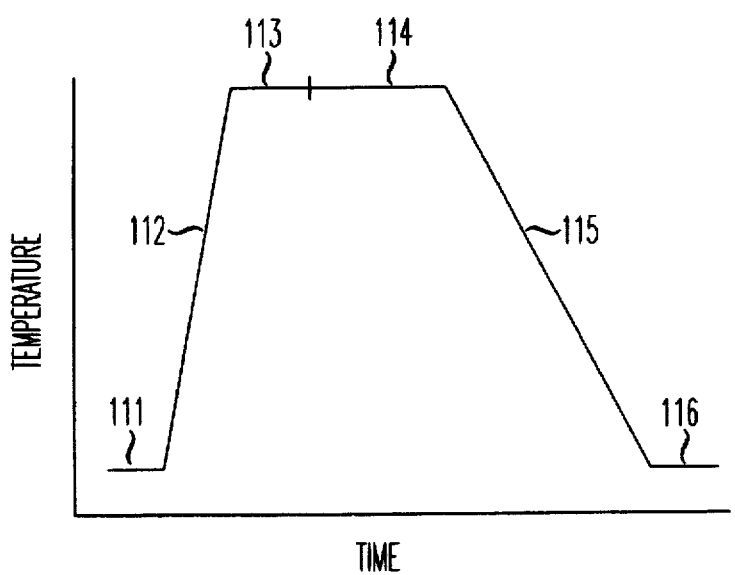
FIG. 2 is a graph of temperature versus time for an illustrative embodiment of applicant's inventive diffusion process.

Applicant's inventive process helps to minimize polysilicon layer reconstruction during the doping process and the resultant oxide fill roughening. In applicant's inventive process, both the total time spent at high temperature and the doping temperature are decreased. For example, the doping temperature is less than or equal to 850° C. Furthermore, the explicit post-doping anneal step (step 5 in FIG. 1 and Table 1) is combined with the furnace ramp-down step (step 6 in FIG. 1 and Table 1) to assist in reducing silicon and post-etch oxide film roughness. The applicant's improved thermal cycle is depicted in FIG. 2 and described in Table 2.

TABLE 2

| STEP | TEMP. (°C.) | RAMP RATE (°C./min.) | GAS FLOW (lpm) liters per min | DURATION (minutes) |
|---|---|---|---|---|
| 111 | 750 | — | 27.0 lpm N₂ | — |
| 112 | Variable, increasing | 3.7 | 27.0 lpm N₂ | 40 |
| 113 | 850≦ | — | 27.0 lpm N₂ 0.8 lpm O₂ | 35 |
| 114 | 850≦ | — | 1.5 lpm N₂/PBr₃ 7.0 lpm N₂ 0.14 lpm O₂ | 40 |
| 115 | Variable, decreasing | 1.5 | 23.0 lpm N₂ 0.27 lpm O₂ | 33.5 |
| 116 | 750 | — | 23.0 lpm N₂ 0.2 lpm O₂ | 70 |

In applicant's improved process, in the step denoted by reference numeral 111, wafers are placed in a reaction chamber at an ambient temperature of 750° C. with a nitrogen gas flow. Step 111 is analogous to step 1 of FIG. 1/Table 1. In step 112 (akin to step 2 of FIG. 1/Table 1) the temperature is increased while nitrogen continues to flow. In step 113 the temperatures peaks at 850° C. or less. Nitrogen and oxygen are flowed through the chamber. In step 114, with the temperature maintained at 850° C. or less, a phosphorus precursor laden vapor is introduced, together with nitrogen and oxygen for a predetermined duration. Then in step 115 the temperature is reduced linearly at about 1° C. per minute after the phosphorous-containing gas has been eliminated for a period of 105 minutes. Phosphorus-gas flow has been eliminated. Step 115 combines both the explicit post-doping anneal step (step 5 of FIG. 1/Table 1) with the furnace ramp-down step (step 6 of FIG. 1/Table 1). Thus, the total time spent at elevated temperatures in the present invention is reduced. Finally, step 116 (akin to step 7 of FIG. 1/Table 1) is performed.

Applicant's process described above, is an illustrative embodiment, reduces the highest temperature endured by the wafers, together with elimination of the post-doping anneal step, helps to reduce the resulting gate oxide roughness.

In general, applicant has found that the extent of silicon layer reconstruction is proportional to the total time spent at elevated temperatures (i.e., T>700° C.) and also proportioned to the highest temperature used. A variety of additional improvements to the processes of FIG. 1/TABLE 1 and FIG. 2/TABLE 2 may be made.

For example, the duration of steps 3 or 113 may be reduced from 35 minutes to 5 minutes or less. The duration of steps 4 or 114 may be reduced to 30 minutes or less, while the N₂/PBr₃ flow is increased to between 3.0 and 2.0 standard liters per minute.

Polysilicon layer 19 may desirably be formed below 550° C. from disilane or a higher silane (thus making it somewhat amorphous and rich in hydrogen).

After layer 19 has been doped, it may be patterned to define a gate. Subsequent processing may include formation of source and drain regions, dielectric deposition, formation of contact openings to the source/drain, metal deposition, etc.

The invention claimed is:

1. A method of integrated circuit manufacture comprising the steps of:

forming a polysilicon layer overlying a substrate at a first temperature;

heating an ambient from said first temperature to an elevated temperature;

exposing said polysilicon layer to said ambient at said elevated temperature;

exposing said polysilicon layer while at said elevated temperature to a gas flow containing a dopant for a period of time;

terminating said dopant gas flow and simultaneously permitting the temperature of said ambient to decrease, said dopant diffusing into said polysilicon layer;

patterning said doped polysilicon layer to define a gate; and forming source and drain regions in the substrate.

2. The method of claim 1 in which said gas includes PBr₃.

3. The method of claim 1 in which said elevated temperature is less than 850° C.

4. A method of integrated circuit manufacture comprising the steps of:

forming a polysilicon layer overlying a substrate at a first temperature;

heating an ambient from said first temperature to an elevated temperature;

exposing said polysilicon layer to said ambient at said elevated temperature for less than five minutes;

exposing said polysilicon layer to a dopant gas flow for a period of time;

terminating said dopant gas flow, and simultaneously permitting the temperature of said ambient to decrease, said dopant diffusing into said polysilicon layer;

patterning said doped polysilicon layer to define a gate; and forming source and drain regions in the substrate.

5. The method of claim 4 in which said gas includes PBr₃.

6. The method of claim 4 in which said elevated temperature is less than 850° C.

7. The method of claim 4 in which said period of time is less than 30 minutes.

8. A method of integrated circuit manufacture comprising the steps of:

forming a polysilicon layer overlying a substrate;

exposing said polysilicon layer to a dopant gas flow for less than 30 minutes;

terminating said dopant gas flow, and simultaneously permitting a temperature to decrease, said dopant diffusing into said polysilicon layer;

patterning said doped polysilicon layer to define a gate;

forming source and drain regions in the substrate.

9. The method of claim 8 in which said gas includes $PBr_3$.

10. The method of claim 8 in which said exposing step is performed at a temperature less than 850° C.

* * * * *